(12) United States Patent
Banerjee et al.

(10) Patent No.: US 11,100,984 B2
(45) Date of Patent: Aug. 24, 2021

(54) NON VOLATILE CROSS POINT MEMORY HAVING WORD LINE PASS TRANSISTOR WITH MULTIPLE ACTIVE STATES

(71) Applicant: Intel Corporation, Santa Clara, CA (US)

(72) Inventors: Koushik Banerjee, Milpitas, CA (US); Sanjay Rangan, Albuquerque, NM (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/748,104

(22) Filed: Jan. 21, 2020

(65) Prior Publication Data

US 2021/0225444 A1 Jul. 22, 2021

(51) Int. Cl.
*G11C 8/00* (2006.01)
*G11C 13/00* (2006.01)
*G11C 11/56* (2006.01)

(52) U.S. Cl.
CPC .......... *G11C 13/0028* (2013.01); *G11C 11/56* (2013.01); *G11C 13/004* (2013.01); *G11C 13/0026* (2013.01); *G11C 13/0069* (2013.01); *G11C 2213/71* (2013.01)

(58) Field of Classification Search
CPC .................................................... G11C 13/0028
USPC .......................................................... 365/230.06
See application file for complete search history.

(56) References Cited

U.S. PATENT DOCUMENTS

| | | | |
|---|---|---|---|
| 9,196,357 B2 | 11/2015 | Sarpatwari et al. | |
| 9,384,801 B2 | 7/2016 | Pandey et al. | |
| 9,583,187 B2 | 2/2017 | Rangan et al. | |
| 9,608,042 B2 | 3/2017 | Pellizzer et al. | |
| 10,553,286 B2 | 2/2020 | Banerjee et al. | |
| 10,796,761 B2 | 10/2020 | Banerjee et al. | |
| 10,884,640 B2 | 1/2021 | Banerjee et al. | |
| 2012/0176832 A1* | 7/2012 | Chevallier | G11C 13/0011 365/148 |
| 2016/0284387 A1* | 9/2016 | Chen | G11C 8/08 |

* cited by examiner

*Primary Examiner* — Hoai V Ho
(74) *Attorney, Agent, or Firm* — Compass IP Law PC

(57) ABSTRACT

An apparatus is described. The apparatus includes a cross-point non volatile memory cell array comprised of a first plurality of access lines and a second orthogonal plurality of access lines. Each of the first plurality of access lines are coupled to a first address decoder through a respective pass transistor. The pass transistor is coupled to control circuitry to bias the pass transistor into one of at least two states that include a first active state determined from a second address decoder and a second active state determined from the second address decoder.

20 Claims, 5 Drawing Sheets

NON VOLATILE CROSS POINT MEMORY HAVING WORD LINE PASS TRANSISTOR WITH MULTIPLE ACTIVE STATES

FIELD OF INVENTION

The field of invention pertains generally to the electrical arts, and, more specifically, to a non volatile cross point memory having word line pass transistor with multiple active states.

BACKGROUND

As the densities of memory arrays continues to expand the engineers who design them are continually confronted with new challenges. One such challenge is the increase in access wiring length and/or capacitance and the associated problems that can create for the quality of the signals that are passed over them.

FIGURES

A better understanding of the present invention can be obtained from the following detailed description in conjunction with the following drawings, in which.

DETAILED DESCRIPTION

Figure 1:
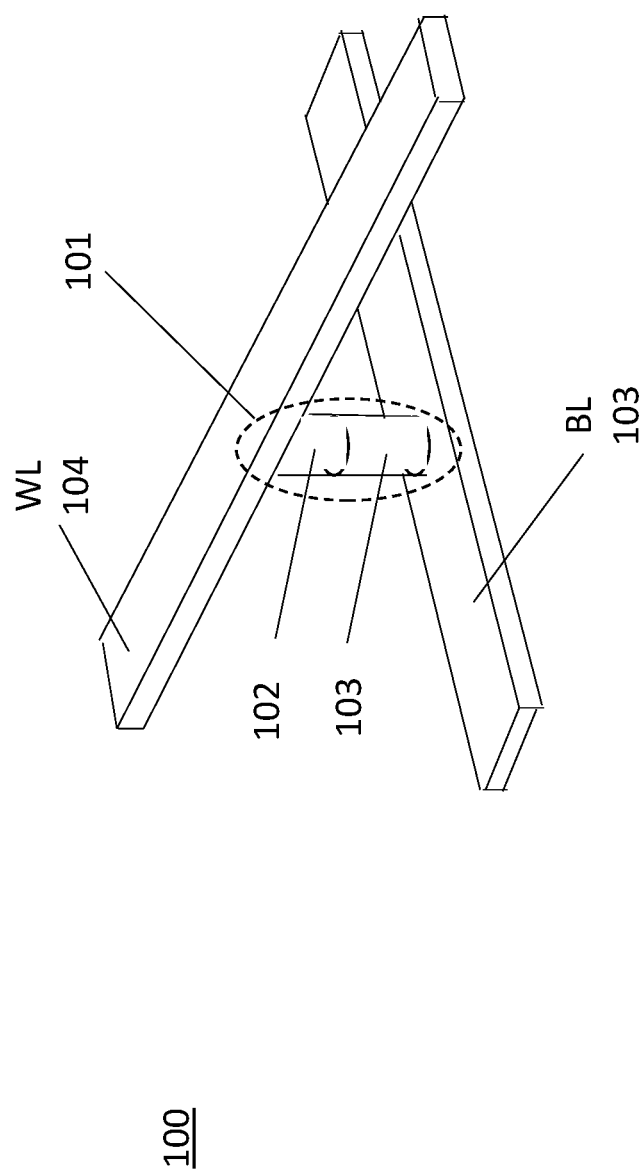
FIG. 1 shows a non volatile cross-point memory cell.

FIG. 1 shows a standard design 100 for a non volatile memory cell 101 and its cross point access wiring 104, 105. As observed in FIG. 1, the memory cell 101 includes an access element 102 in series with a non volatile storage element 103. Orthogonally oriented access wires 104, 105 are routed on opposite sides of the memory cell 101.

One of the wires, referred to as a word line 104, is coupled to the memory cell's access element 102 along a "row" direction of a memory array. Another set of wires, referred to as a bit line 105, is coupled to the memory cell's storage element 103.

With respect to a larger memory array, which is not depicted in FIG. 1 for illustrative ease, memory cells and their associated access wiring are stacked upon one another to form a single memory cell "stack". Multiple memory cells stacks are arranged in an array to effectively form a three dimensional memory cell array. That is, the three dimensional array includes a lowest level which is composed of the bottom cells in the stack array, a next lowest level which is composed of the second to bottom cells in the stack array, etc. At each level, one word line exists for each array increment in the column direction and one bit line exists for each array increment in the row direction.

Access to a storage element 103 is accomplished by activating the storage element's word line 104 and bit line 105. That is, nominally, the selection element 102 of a memory cell is off making the non volatile storage element 103 inaccessible. By contrast, if the memory cell's word and bit lines 104, 105 are activated, the memory cell's selection element 102 turns on making the non volatile storage element 103 accessible through the word and bit lines 104, 105.

In the case of a write, a write activation voltage and/or current bias is applied to the memory cell's word line 104 and bit line 105, which, in turn, is applied to the memory cell's storage element 103. One state of applied biases (e.g., of a first polarity or magnitude) sets the storage element 103 to a first resistance, whereas, a second state of applied biases (e.g., of a second polarity or magnitude) sets the storage element 103 to a second resistance. Which of the first or second bias states is applied therefore determines the binary information stored by the storage element 103 (conceivably, more bias states could be applied to store multi-bit values in the storage element).

In the case of a read, a read activation voltage and/or current bias is applied to the memory cell's word line 104 and bit line 105 which generates a read signal on the bit line 105. The magnitude and/or direction of the read signal is a function of the resistance of the memory cell's storage element 103 (which was set as per the last write operation performed on the storage element). That is, according to one approach, if a read voltage is applied across the word line 104 and bit line 105, a current will flow through the bit line 105 in proportion to the magnitude of the read voltage and in inverse proportion to the magnitude of the storage element's resistance. Thus, the information stored by the storage element 103 is read by sensing the magnitude of the current that flows through the bit line 105 in response to the applied read voltage.

Figure 2:
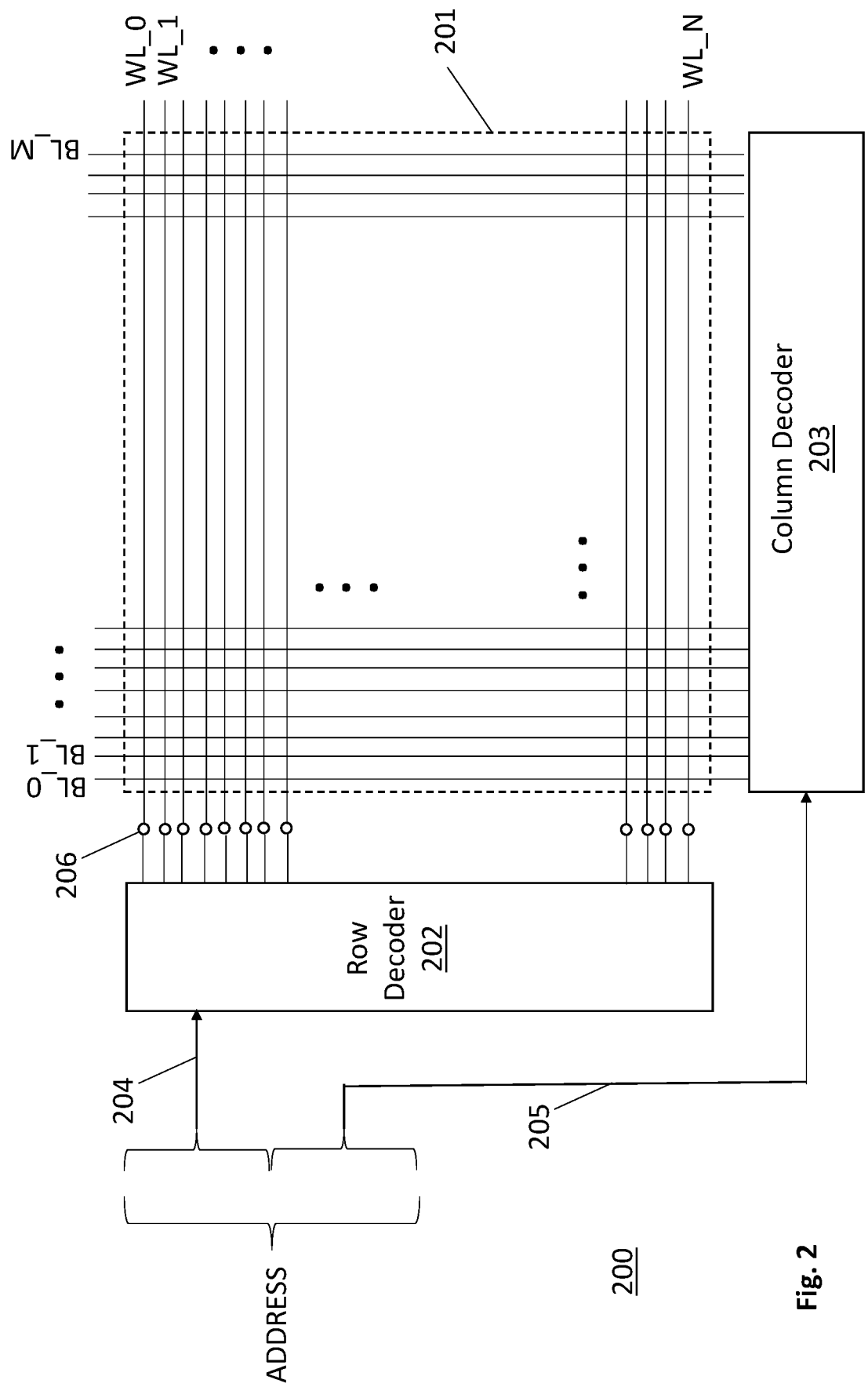
FIG. 2 shows a top down view of a three dimensional non volatile cross-point memory.

FIG. 2, shows a top down view of a three dimensional memory array 200. Because a top-down view is depicted, only the top level's access wiring 201 is observed. That is, there is one instance of the access wiring 201 observed in FIG. 2 for each level in the three dimensional memory array (with each instance of wiring being beneath the top level's access wiring 201).

As can be seen in FIG. 2, a received address is broken down into a row portion 204 and a column portion 205. The row portion 204 is directed to a row address decoder 202 and the column portion 205 is directed to a column address decoder 203. The row address decoder 202 drives the word lines of the array and the column address decoder 203 drives the bit lines of the array.

According to one approach, each unique address causes the activation of one word line and a group of bit lines along a same level where the number of activated bit lines in the group is equal to the size of the data word being written to or read from the array. In an alternative approach, each unique address resolves to the same word-line/bit-line cross-point location across multiple levels of the three dimensional array, and, the number of activated levels corresponds to the size of the data word being written to or read from the array. Other lateral and/or vertical row and columns accessing combinations are possible. Regardless, the set of memory cells that are coupled to the cross-point of an activated word line and activated bit line during a read/write operation are the memory cells that are accessed during the read/write operation.

As can be seen in FIG. 2, the distance from the row decoder 202 to the memory cells varies along the length of the array's word line. That is, cells that are closer to the row decoder 202 can be referred to as near cells whereas cells that are farther from the row decoder 202 can be referred to as far cells.

A concern is the magnitude of the word line signal that is emitted from the row decoder on any of the array's word lines. Specifically, without proper precautions, the near cells can be damaged if repeatedly subjected to word line signals having too large an amplitude.

As such, as seen in FIG. 2, each word line includes a pass transistor 206 whose channel resistance is fixed (with a fixed gate node setting) to diminish the amplitude of the row signal emitted by the row decoder 202 as observed by the cells in the array thereby protecting the near cells (for ease of drawing, only the pass transistor for word line WL_0 is explicitly labeled in FIG. 2). That is, during device manufacturing, the gate node of the pass transistor 206 is set ("trimmed" with a blown fuse setting) so that there is a fixed drop in word line signal amplitude as the word line signal passes through the pass transistor 206. With the fixed drop in signal amplitude, the near cells do not receive a full amplitude signal and are protected against damage created by excessive word line signal amplitude.

A problem, however, is that the amplitude of a row signal needs to be large enough so that the far cells receive a strong enough signal when they are being accessed. As memory arrays are getting larger, including increasing numbers of bit line columns per word line and corresponding increase in word line length, it is becoming more and more difficult to trim a pass transistor 206 with a single setting so that it protects the near cells yet leaves sufficient remnant word line signal amplitude so that the far cells receive a sufficiently strong signal for reliable reception.

Figure 3:
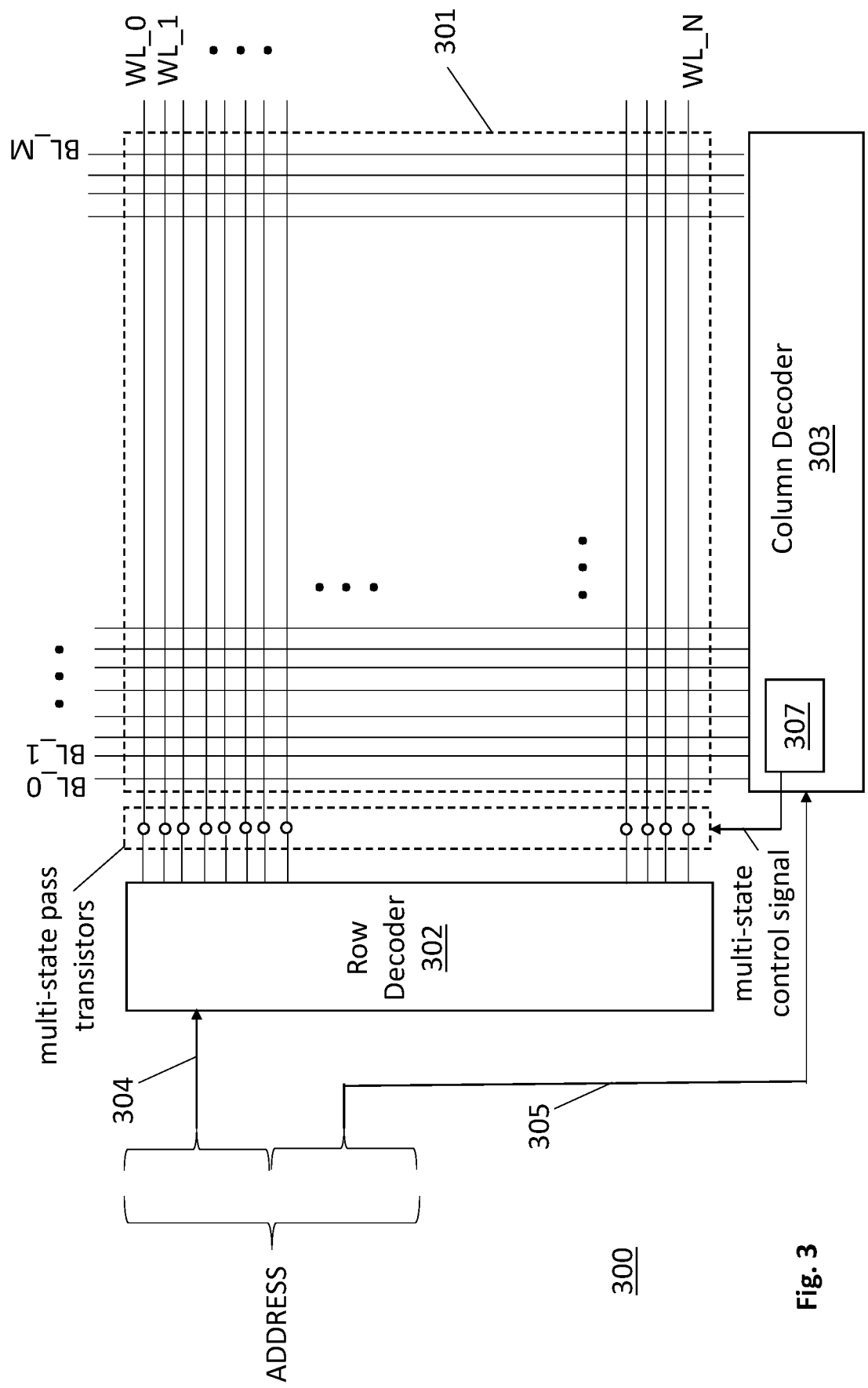
FIG. 3 shows a top down view of an improved three dimensional non volatile cross-point memory.

As such, FIG. 3 shows an improved approach in which the gate node of the pass transistor is not trimmed to a single, fixed voltage, but rather, can be set to one of multiple states depending on how near or far the cells being accessed are from the row decoder 302 during any particular read or write operation.

That is, according to a two-state solution, if near cells are being accessed, the pass transistor of the activated word line is set to a first state that is closer to cutoff (which corresponds to high channel resistance through the pass transistor) so that the amplitude of the word line signal will have a large drop across the pass transistor thereby protecting the near cells. By contrast, if far cells are being accessed, the pass transistor of the activated word line is set to a second state that is father away from cutoff than the first state. As a consequence, the amplitude drop is not as large as the first state so that the far cells receive sufficient word line signal amplitude.

In some embodiments there is no/little amplitude drop at all in the second state (e.g., the pass transistor is fully on with little/no channel resistance). In further embodiments, there exists some appreciable amplitude drop in the second state so that there is at least some protection provided to the near cells during far cell access. Other embodiments may introduce additional intermediary states, e.g., when cells in between near and far are accessed that, drop the amplitude less than the first state but more than the second state as described above.

Thus, by designing the pass transistor of any word line to have multiple pass states and corresponding channel resistances, activate word line signal amplitude can be better modulated to provide: 1) for near side accesses, maximum word line signal amplitude drop to provide maximum protection for the near cells; and, 2) for far cell accesses, less word line signal amplitude drop to enable reliable far cell access. As described above, in extended embodiments, for far cell accesses, the word line signal amplitude drop can be large enough so that the minimal strength signal for reliable far cell reception is created, and, at least some protection of near cells is also realized (e.g., at least compared to little/no amplitude drop at all).

As observed in FIG. 3, a pass transistor's gate node setting is determined by pass gate state determination circuitry 307 within the column decoder 303. Here, the column decoder understands which bit lines are being accessed for any particular read or write operation and, from that understanding, the determination circuitry can set the appropriate state for the pass transistor. For example, if only a single bit line is activated per array level during a read or write access, if the bit line is within a number of closest bit lines to the row decoder the maximum amplitude drop state is enabled, and/or, if the bit line is within a number of farthest bit lines from the row decoder the minimum amplitude drop state is enabled.

By contrast, if more than one bit line is activated per array level during a read or write access, the determination circuitry can determine which setting is appropriate for the set of activated bit lines (generally, the set of enabled bit lines on a same level for any access should be characterized identically so that the entire group can be characterized as near or far).

Figure 4:
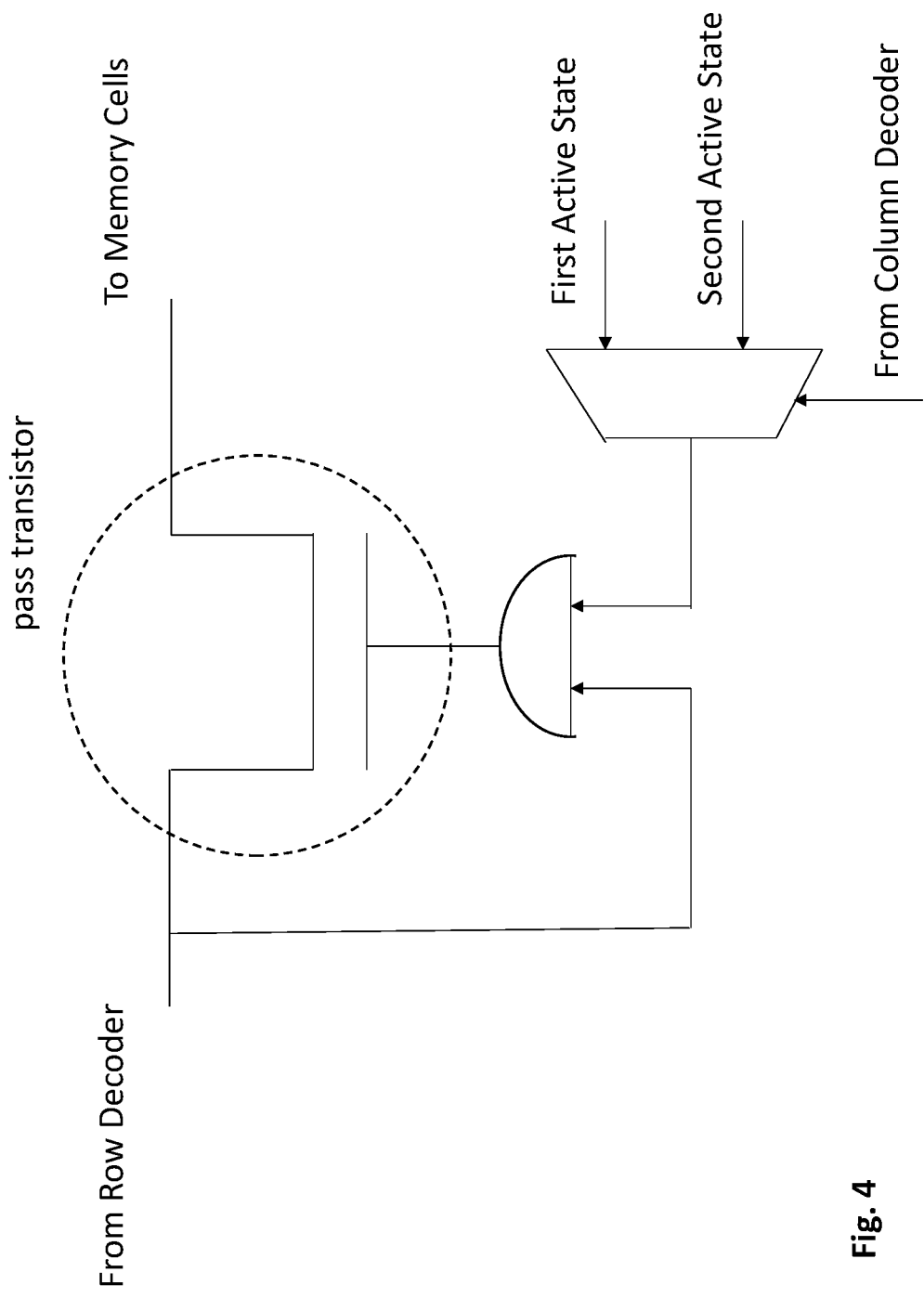
FIG. 4 shows control circuitry for a word line pass transistor.

FIG. 4 shows an embodiment of the immediate circuitry that affects the state of a pass transistor for a particular word line. Here, the pass transistor is configured to have first and second active states (as described above) and a third off state when the pass transistor's word line is not being activated. As such, the circuitry accepts the word line signal as emitted by the row decoder as a first input signal. If the word line signal is activated the pass transistor turns on, or, if the word line signal is inactive the pass transistor is off. If the word line signal is active, the pass transistor is on and placed into one of first and second active states as determined by the column decoder in view of whether near or far cells are being accessed.

In further embodiments, the values of the first and second active states can vary based on which word line the pass transistor is coupled to and/or what level of the three dimensional array the pass transistor resides on. Here, a word line's capacitance can affect how much word line signal amplitude reduction is appropriate for either the first and second active states (generally, the more word line capacitance, the less the word line signal's amplitude should be reduced, particularly for far cells). Because word line capacitance can vary as a function of word line on any particular array level and/or across array levels, customized first and/or second active state settings can be set (e.g., during manufacture with blown fuse technology, configurable register space, etc.) based on these parameters.

Although FIG. 1 illustrated a memory cell with a selection element 102, it is conceivable that at lease some storage element 103 compositions do not need a selection element because they are made conductive or otherwise accessible based on nominal word line and bit line biasing.

The three dimensional memory array described above can be comprised of an emerging non volatile random access memory technology such as, to name a few possibilities, a phase change based memory, memory devices having storage cells composed of chalcogenide, a ferro-electric based memory (e.g., FRAM), a magnetic based memory (e.g., MRAM), a spin transfer torque based memory (e.g., STT-RAM), a resistor based memory (e.g., ReRAM), a Memristor based memory, universal memory, Ge2Sb2Te5 memory, programmable metallization cell memory, amorphous cell memory, Ovshinsky memory, etc.

Any of these technologies may be byte addressable so as to be implemented as a system memory in a computing system (also referred to as a "main memory") rather than traditional block or sector based non volatile mass storage. Memory chips composed of such non volatile memory arrays may be stacked or not stacked and packaged in a system memory memory module (e.g., a dual in-line memory module (DIMM)). Alternatively the memory arrays can be integrated on a high density logic die such as multi-core processor chip having multiple general purpose processing cores, a main memory controller, a peripheral hub controller, etc.

Apart from main memory applications, memory chips composed of the memory arrays described above may be, e.g., integrated into a solid state drive (SSD) for, e.g., a traditional non volatile mass storage application (e.g., as a hard disk drive replacement).

Figure 5:
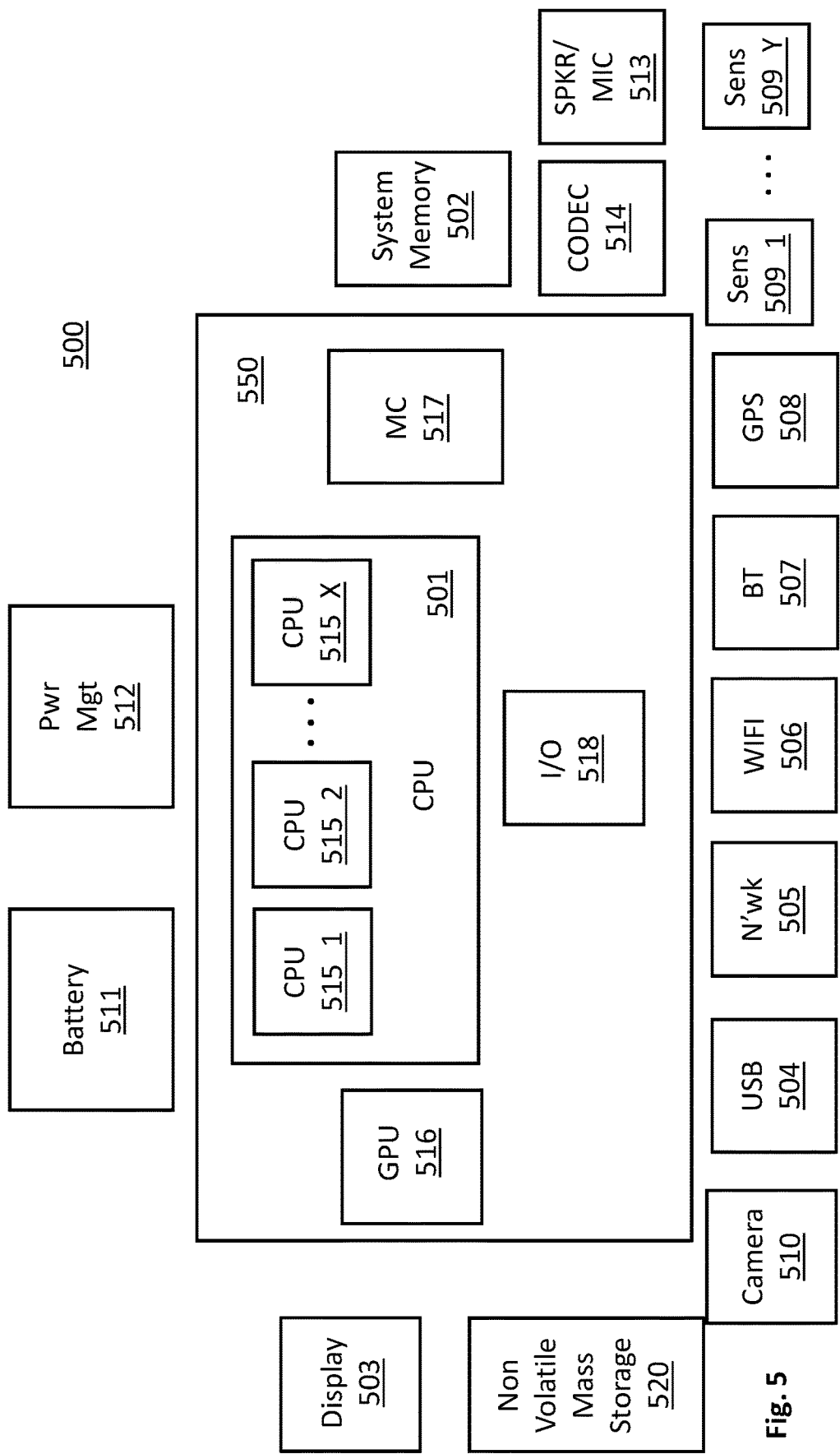
FIG. 5 shows a computing system.

FIG. 5 provides an exemplary depiction of a computing system 500 (e.g., a smartphone, a tablet computer, a laptop computer, a desktop computer, a server computer, etc.). As observed in FIG. 5, the basic computing system 500 may include a central processing unit 501 (which may include, e.g., a plurality of general purpose processing cores 515_1 through 515_X) and a main memory controller 517 disposed on a multi-core processor or applications processor, system memory 502, a display 503 (e.g., touchscreen, flat-panel), a local wired point-to-point link (e.g., USB) interface 504, various network I/O functions 505 (such as an Ethernet interface and/or cellular modem subsystem), a wireless local area network (e.g., WiFi) interface 506, a wireless point-to-point link (e.g., Bluetooth) interface 507 and a Global Positioning System interface 508, various sensors 509_1 through 509_Y, one or more cameras 510, a battery 511, a power management control unit 512, a speaker and microphone 513 and an audio coder/decoder 514.

An applications processor or multi-core processor 550 may include one or more general purpose processing cores 515 within its CPU 501, one or more graphical processing units 516, a memory management function 517 (e.g., a memory controller) and an I/O control function 518. The general purpose processing cores 515 typically execute the system and application software of the computing system. The graphics processing unit 516 typically executes graphics intensive functions to, e.g., generate graphics information that is presented on the display 503. The memory control function 517 interfaces with the system memory 502 to write/read data to/from system memory 502.

Any of the system memory 502 and/or non volatile mass storage 520 can be composed with a three dimensional non volatile memory array having word lines whose pass transistors can be placed into more than one active (on) state as described at length above.

Each of the touchscreen display 503, the communication interfaces 504-507, the GPS interface 508, the sensors 509, the camera(s) 510, and the speaker/microphone codec 513, 514 all can be viewed as various forms of I/O (input and/or output) relative to the overall computing system including, where appropriate, an integrated peripheral device as well (e.g., the one or more cameras 510). Depending on implementation, various ones of these I/O components may be integrated on the applications processor/multi-core processor 550 or may be located off the die or outside the package of the applications processor/multi-core processor 550. The power management control unit 512 generally controls the power consumption of the system 500.

Embodiments of the invention may include various processes as set forth above. The processes may be embodied in machine-executable instructions. The instructions can be used to cause a general-purpose or special-purpose processor to perform certain processes. Alternatively, these processes may be performed by specific/custom hardware components that contain hardwired logic circuitry or programmable logic circuitry (e.g., FPGA, PLD) for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. An apparatus, comprising:
a cross-point non volatile memory cell array comprised of a first plurality of access lines and a second orthogonal plurality of access lines, each of the first plurality of access lines coupled to a first address decoder through a respective pass transistor, the pass transistor coupled to control circuitry to bias the pass transistor into one of at least two states comprising:
a first active state determined from a second address decoder;
a second active state determined from the second address decoder.

2. The apparatus of claim 1 wherein the first address decoder is a row address decoder and the second address decoder is a column address decoder.

3. The apparatus of claim 1 wherein the first plurality of access lines are word lines and the second plurality of access lines are bit lines.

4. The apparatus of claim 1 wherein the first active state is to be activated when near memory cells are accessed.

5. The apparatus of claim 1 wherein the second active state is to be activated when far memory cells are activated.

6. The apparatus of claim 5 wherein the second active state is to cause a signal amplitude drop through the pass transistor that protects near memory cells yet provides the far memory cells with sufficient signal strength for reliable reception by the far memory cells.

7. The apparatus of claim 1 wherein the at least two states further comprise an inactive or active state determined from the first address decoder.

8. A computing system, comprising:
a plurality of processing cores;
a memory controller;
a peripheral control hub;

a cross-point non volatile memory cell array comprised of a first plurality of access lines and a second orthogonal plurality of access lines, each of the first plurality of access lines coupled to a first address decoder through a respective pass transistor, the pass transistor coupled to control circuitry to bias the pass transistor into one of at least two states comprising:
- a first active state determined from a second address decoder;
- a second active state determined from the second address decoder.

9. The computing system of claim 8 wherein the first address decoder is a row address decoder and the second address decoder is a column address decoder.

10. The computing system of claim 8 wherein the first plurality of access lines are word lines and the second plurality of access lines are bit lines.

11. The computing system of claim 8 wherein the first active state is to be activated when near memory cells are accessed.

12. The computing system of claim 8 wherein the second active state is to be activated when far memory cells are activated.

13. The computing system of claim 12 wherein the second active state is to cause a signal amplitude drop through the pass transistor that protects near memory cells yet provides the far memory cells with sufficient signal strength for reliable reception by the far memory cells.

14. The computing system of claim 8 wherein the at least two states further comprise an inactive or active state determined from the first address decoder.

15. The computing system of claim 8 wherein the cross-point non volatile memory cell array is a component of the computing system's main memory.

16. The computing system of claim 8 wherein the cross-point non volatile memory cell array is a component of the computing system's non volatile mass storage.

17. A method, comprising:
propagating a first activation signal on a word line of a cross-point non volatile memory cell array, the propagating comprising reducing an amplitude of the first activation signal by a first amount, the first activation signal to access a first non volatile memory cell that is coupled to the word line; and,
propagating a second activation signal on the word line, the propagating comprising reducing an amplitude of the second activation signal by a second amount, the second activation signal to access a second non volatile memory cell that is coupled to the word line, the first non volatile memory cell being closer to a row decoder than the second non volatile memory cell, the first amount greater than the second amount, the first and second activation signals originating from the row decoder.

18. The method of claim 17 further comprising generating a first signal with a column decoder that sets the first amount.

19. The method of claim 18 further comprising generating a second signal with the column decoder that sets the second amount.

20. The method of claim 17 wherein the method is performed within a computing system's main memory.

* * * * *